United States Patent [19]

Jensen et al.

[11] Patent Number: 4,933,207
[45] Date of Patent: Jun. 12, 1990

[54] LASER AND THERMAL ASSISTED CHEMICAL VAPOR DEPOSITION OF MERCURY CONTAINING COMPOUNDS

[75] Inventors: John E. Jensen, Newbury Park; Lee W. Tutt, Woodland Hills, both of Calif.

[73] Assignee: Hughes Aircraft Company, Los Angeles, Calif.

[21] Appl. No.: 376,189

[22] Filed: Jun. 30, 1989

Related U.S. Application Data

[63] Continuation-in-part of Ser. No. 146,935, Jan. 22, 1988, abandoned.

[51] Int. Cl.$^5$ ............................ B05D 3/06; C23C 16/30
[52] U.S. Cl. ................................. 427/53.1; 427/50; 427/76; 427/126.1; 427/252; 427/255; 427/255.2
[58] Field of Search ............... 427/53.1, 76, 50, 126.1, 427/255, 124, 255.2, 252; 437/234, 225

[56] References Cited

U.S. PATENT DOCUMENTS

| | | | |
|---|---|---|---|
| 3,218,203 | 11/1965 | Ruehrwein | 427/255.2 |
| 3,218,204 | 11/1965 | Ruehrwein | 427/255.2 |
| 4,352,834 | 10/1982 | Taketoshi et al. | 427/76 |
| 4,418,096 | 11/1983 | Gauthier et al. | 427/76 |
| 4,435,224 | 3/1984 | Durand | 427/76 |
| 4,436,580 | 3/1984 | Boyd et al. | 427/76 |
| 4,447,470 | 5/1984 | Kay | 427/76 |
| 4,523,051 | 6/1985 | Mickelsen et al. | 427/76 |
| 4,650,539 | 3/1987 | Irvine et al. | 437/234 |
| 4,655,848 | 4/1987 | Kay et al. | 427/76 |
| 4,701,997 | 10/1987 | Kita et al. | 427/76 |
| 4,740,386 | 4/1988 | Cheung | 427/76 |

OTHER PUBLICATIONS

S. Irvine et al, "Photo-Metal Organic Vapor Phase Epitaxy: A Low Temperature Method for the Growth of $Cd_xHg_{1-x}Te$," J. Vac. Sci. Tech. B 3 (5), Sep./Oct. 1985, pp. 1450-1455.

W. Hoke et al, "Low-Temperature Metalorganic Growth of CdTe and HgTe Films Using Ditertiarybutyltelluride", Appl. Phys. Lett. 48 (24), 6/16/86.

W. Hoke et al, "Metalorganic Growth of CdTe and HgCdTe Epitaxial Films at a Reduced Substrate Temperature using Diisopropyltelluride," Appl. Phys. Lett. 46 (4), 2/15/85, pp. 398-400.

B. J. Morris, Appl. Phys. Lett., 48(13), 3/31/86, "Photochemical Organometallic Vapor Phase Epitaxy of Mercury Cadmium Telluride," pp. 867-869.

Ext. Absts. of the 17th Conf. on Solid State Devices & Materials, Tokyo, 1985, pp. 159-163, S. Irvine et al, "Photo-Epitaxial Growth of HgTe and Related Materials".

Irvine et al, "Photochemical Processes in Photo-Assisted Epitaxy of $Cd_xHg_{1-x}Te$", MRS Symp. R. Boston, 1986.

C. Wang et al, "Epitaxial Growth of HgTe by Precracking Metalorganic Mercury and Tellurium Compounds," Appl. Phys. Lett. 48 (16), Apr. 21, 1986, pp. 1085-1086.

*Primary Examiner*—Sadie Childs
*Attorney, Agent, or Firm*—Paul M. Coble; Wanda K. Denson-Low

[57] ABSTRACT

A mercury compound such as mercury telluride or mercury cadmium telluride is deposited upon a substrate by chemical vapor deposition, with dissociation of the organic compounds accelerated by laser energy. The mercury-containing compound is preferably divinylmercury, which dissociates under intense light of 248 nanometers wavelength to deposit mercury in combination with the codeposited element. The laser-assisted chemical vapor deposition is accomplished at 100° C. to 195° C., preferably 165° C., without the deposition of carbon contaminants.

15 Claims, 2 Drawing Sheets

LASER AND THERMAL ASSISTED CHEMICAL VAPOR DEPOSITION OF MERCURY CONTAINING COMPOUNDS

This application is a continuation-in-part of application Ser. No. 07/146,935, filed 1/22/88 now abandoned.

BACKGROUND OF THE INVENTION

This invention relates to the deposition of compounds on substrates, and, more particularly, to laser and thermal assisted chemical vapor deposition of mercury-containing compounds.

The deposition of compounds on substrates is one of the standard manufacturing techniques in constructing a variety of electronic, optical, and opto-electronic devices. Such techniques usually call for the deposition of thin layers of a substance onto a substrate, the layer usually being less than 0.001 inches thick. The crystalline perfection of the resulting structure is usually critical to the successful functioning of the final product, and various techniques have been selected, modified, and optimized for use in particular applications.

One of the commonly used deposition techniques is chemical vapor deposition. In metal organic chemical vapor deposition (MOCVD), each metal to be codeposited upon the substrate is combined into an organic molecule, and the two (or more) types of reactant organic molecules are stored in reservoirs. Appropriate amounts of the reactant molecules are mixed into a carrier gas stream, which is then introduced into a reaction chamber that contains the substrate. The substrate is heated to aid in decomposing the organic molecules, and to aid in their deposition on the substrate surface. At normal deposition temperatures of 300° C. or greater, the metal organic molecules decompose at the surface of the substrate, depositing their metal atoms onto the surface and freeing the organic residues to be carried away in the flowing gas stream.

Conventional MOCVD processes require high temperatures, which can result in degraded microstructures and excessive interdiffusion in the deposited layer on the substrate, and in the substrate itself. To reduce the adverse effect of elevated temperatures on the final structures, a beam assisted variant of MOCVD has been developed. In assisted MOCVD, a high energy field is supplied to the metal organic vapor at the surface of the substrate. The beam imparts energy to the vapor, which assists in its decomposition at a lower temperature than possible with unassisted MOCVD.

One class of industrially important compounds deposited by MOCVD is mercury-containing compounds such as mercury telluride (HgTe) and mercury cadmium telluride (HgCdTe). These materials are deposited in thin films less than 0.001 inches thick, and in this form absorb impinging infrared energy to produce an electrical signal. The compounds can therefore be used as infrared detectors.

Such mercury-containing compounds are normally deposited by MOCVD from a mixture of dimethylmercury and diethyltellurium. When the deposition is unassisted and at a substrate temperature of greater than 300° C., there is extensive interdiffusion and degradation of the structure. When beam-assisted MOCVD is used, a lower temperature is possible, but there remain significant problems with the resulting structure. One problem is that the mercury content of the structure is low, another is the inclusion of carbon contaminants in the deposited layer, and the third is a poor surface morphology.

There therefore is a need for an improved beam-assisted chemical vapor deposition technique for compounds containing mercury, that achieves the benefits of low-temperature deposition but does not exhibit the deficiencies mentioned above. The present invention fulfills this need, and further provides related advantages.

SUMMARY OF THE INVENTION

The present invention is embodied in a laser and thermal assisted chemical vapor deposition process utilizing a new source of the mercury atoms. The process of the invention permits the deposition of mercury-containing compounds from the organic vapors at low temperatures, which results in improved surface morphology of the as-deposited compounds and minimal detrimental interdiffusion. The chemistry of the system results in low carbon contamination of the structure. The laser-assisted chemical vapor deposition requires a deposition chamber providing access of the surface of the substrate to the laser beam.

In accordance with the invention, a process for depositing a mercury-containing compound onto a substrate comprises the steps of providing a substrate; heating the substrate to a temperature of from about 100° C. to about 195° C.; contacting the substrate with a vapor mixture of a mercury-containing organic compound having at least one vinyl group, and an organic compound containing an element to be codeposited with mercury; and exciting the vapor mixture with an activator sufficient to deposit the mercury containing compound in the region of contact between the vapor and the substrate. The activator is selected from the group consisting of a laser light of a wavelength of from about 180 to about 300 nanometers wavelength, or a thermal heat source.

In a preferred embodiment, a process for depositing mercury telluride onto a substrate comprises the steps of providing a substrate; heating the substrate to a temperature of about 165° C.; contacting the substrate with a vapor mixture of divinylmercury and diethyltellurium; and exciting the vapor mixture with laser light of a wavelength of about 248 nanometers wavelength, in the region of the contact between the vapor and the substrate.

More broadly, a process for depositing a mercury-containing compound onto a substrate comprises the steps of providing a substrate; heating the substrate to a temperature of from about 100° C. to about 195° C.; contacting the substrate with a vapor mixture of a mercury-containing compound having a vapor pressure of at least 100 millitorr at ambient temperature, an absorption coefficient of at least 0.005 Torr$^{-1}$centimeter$^{-1}$ for light in the wavelength range of 180 to 300 nanometers, and a decomposition behavior of decomposing to mercury under sufficiently intense light in the wavelength range of 180 to 300 nanometers, and a vapor containing an element to be codeposited with mercury; and exciting the vapor mixture with laser light of a wavelength of from about 180 to about 300 nanometers wavelength, in the region of the contact between the vapor and the substrate.

A key to the present invention is the development of a new organic source of the mercury atoms for the laser-assisted vapor deposition. In the past, the usual source for the mercury has been dimethylmercury, $(CH_3)_2Hg$. As indicated, the use of dimethylmercury as a source results in irregular surface morphology of the deposited mercury telluride layer, and also in a ratio of mercury to tellurium in the solid layer that is much lower than the ratio predicted from the ratio of mercury to tellurium in the vapor supplied to the chemical vapor deposition chamber. The use of a 27:1 ratio of dimethylmercury to diethyltellurium results in a 0.8:1 ratio of mercury to tellurium in the deposited film, using 248 nanometer wavelength laser light for excitation.

The preferred source of mercury for the present invention is divinylmercury, $(C_2H_3)_2Hg$. It has been found that this compound has an energy absorption band in the 200–250 nanometer range, that is particularly appropriate for laser-assisted chemical vapor deposition where the laser operates at wavelengths in the 180–300 nanometer range. Significantly, the use of a ratio of about 1:1 of divinylmercury to diethyltellurium in the gas phase results in a 1:1 ratio of mercury to tellurium in the deposited film, using 248 nanometer wavelength laser light for excitation. Variants of this structure such as methylvinylmercury, $CH_3(C_2H_3)Hg$, and the compounds $Hg(CHCHCH_3)_2$ and $CH_3Hg(CHCHCH_3)$ exhibit the same absorption band, but to a lesser degree.

The divinylmercury absorbs energy from the laser beam, and dissociates to produce mercury atoms that are deposited upon the heated substrate surface, and volatile organic compounds that are carried away in the gas stream. Because of the absorption band, the dissociation can be conducted at a low temperature, preferably 165° C. At this temperature, interdiffusion within the structure is minimal.

The preferred wavelength of the laser light is 248 nanometers. For shorter wavelengths, there is increased likelihood of further decomposition of the organic fragments, which in turn can result in the decomposition of carbon onto the substrate with the mercury. At higher wavelengths, the absorption of the energy by the divinylmercury is greatly reduced.

The instant invention also relates to thermal deposition of mercury containing compounds. There are limitations to the use of laser assisted deposition, as such a deposition means does require the use of an additional energy source. Additionally, the use of a laser method also requires source materials that can absorb optical energy in the wavelength range provided by the laser or other light source.

Another feature of the present invention is the use of a thermal heat source. This feature of the instant invention is embodied by a process for depositing a mercury-containing compound onto a substrate wherein a substrate is provided and heated to a temperature of from about 100° C. to about 195° C.; the substrate is then contacted with a vapor mixture of a mercury-containing organic compound having at least one vinyl group and an organic compound containing an element to be codeposited with mercury in a carrier gas and exciting the vapor mixture with thermal heat sufficient to deposit the mercury containing compound in the region of contact between the vapor and the substrate.

It will be appreciated that the present invention provides an advance in the art of deposition of mercury-containing compounds onto substrates. Deposition is accomplished at very low temperatures, avoiding interdiffusion within the structure. The deposited structure has an excellent surface, and has a low level of contamination. Other features and advantages of the invention will be apparent from the following more detailed description of the preferred embodiment, taken in conjunction with the accompanying drawings, which illustrate, by way of example, the principles of the invention.

DETAILED DESCRIPTION OF THE PREFERRED EMBODIMENT

Figure 1:
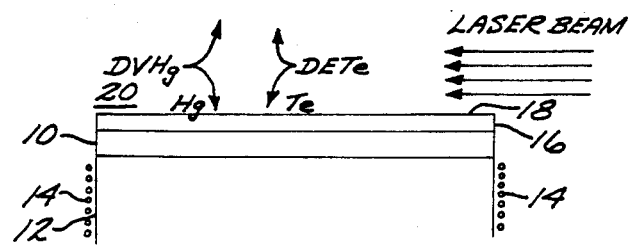
FIG. 1 is a diagrammatic elevational view of a substrate upon which mercury telluride is being deposited by laser-assisted chemical vapor deposition.

A deposition substrate 10 is illustrated in FIG. 1, with a diagrammatic depiction of the photochemical reaction occurring at the surface of, and in the vicinity of, the substrate 10. The substrate 10, which is preferably CdTe, CdZnTe, InSb, or GaAs, is supported on a base 12. A coil 14 of electrical resistance wire is wound on the base 12. A current is passed through the coil 14, which heats the wire and the base 12, and thence the substrate 10 by conduction. At the stage depicted in FIG. 1, a thin layer 16 HgTe (mercury telluride) has already been deposited upon the surface of the substrate 10 by the process of the invention. Thus, the term "substrate" as used herein denotes the substrate material first deposited upon, plus the previously built-up layer 16 of the material being deposited.

A stream of carrier gas, typically helium, hydrogen, or argon, is passed over the surface 18 of the layer 16. Mixed with the helium gas is divinylmercury, abbreviated in the figure as DVHg, and diethyltellurium, abbreviated in the figure as DETe. Laser energy, preferably at 248 nanometers wavelength, is directed through a region 20 immediately above the surface 18. Laser energy of this wavelength is conveniently provided by a krypton-fluorine excimer laser.

The laser energy can be as low as about 180 nanometers wavelength, as for example produced by the argon-fluorine emission at 193 nanometers in an excimer laser. Such short wavelength radiation is not preferred, because at short wavelengths there tend to be undesirable secondary photochemical reactions producing carbon-containing molecules that are deposited upon the surface 18. Carbon may thereby be incorporated into the layer 16 as an impurity.

The laser energy may be at a wavelength extending up to as high as about 300 nanometers, but the absorption band efficiency of the divinylmercury and related compounds is so low at this wavelength that the efficiency of dissociation drops to unacceptably low values.

The laser energy should be provided as near to the surface 18 as possible, termed the grazing mode, and may even impinge upon the surface 18 slightly. Impingement is not preferred, however, as the energy of the laser beam is then transferred into direct heating of the surface 18. Alternatively, the laser beam may be directed downwardly to strike the surface 18, but this approach is less preferred than the grazing mode, for the reason indicated.

Some of the energy of the laser beam is transferred to the DVHg and DETe molecules, causing them to dissociate. In the preferred approach described, each DVHg molecule dissociates into a volatile organic fragment which is carried away, and a mercury atom which deposits upon the surface 18. Each DETe molecule dissociates into one or more volatile organic fragments which are carried away, and a tellurium atom which deposits upon the surface 18. Since the surface 18 is heated to a temperature in the range of 100° C. to 195° C., the deposited mercury and tellurium atoms are mobile on the surface, and can move to preferred low energy sites to add to the epitaxial layer 16.

If the substrate temperature is below about 100° C., the atoms cannot move to the preferred sites. If the substrate temperature is above about 175° C., mercury is lost and the stoichiometry of the deposited layer is adversely affected. Dopants (such as, for example, arsenic or indium) can be added to the layer 16 by including an appropriate amount of an organic source of the dopant atom in the flowing vapor stream. An operable organic source of arsenic is diethylarsenic hydride, and an operable organic source of indium is trimethylindium.

The use of high substrate temperatures above about 195° C. results in undesirable diffusion of the dopant within the layer 16, which adversely affects the electrical performance of devices fabricated in the layer. Where multilayer structures (e.g., CdTe, HgTe, and HgCdTe) are deposited, the migration of mercury and cadmium between layers results in the degradation of the wavelength response of the material for infrared detection applications at long wavelengths of as high as 15-20 micrometers. The preferred substrate temperature is about 165° C., which is sufficiently high to ensure atomic mobilities on the surface but low enough to prevent the indicated adverse effects of too high a temperature.

The process can be used to deposit layers of alloys that include mercury and other elements. Of most interest is the growth of HgCdTe alloys. The alloy $Hg_{0.8}Cd_{0.1}Te$ has a response out to about 20 micrometers in the infrared. An operable organic source of the cadmium is dimethylcadmium. To grow the allow, the organic source of cadmium is added to the carrier gas along with the divinylmercury and the diethyltellurium. The composition of the alloy can be controlled by adjusting the amounts of the organic sources, but the gas phase ratios are typically not duplicated exactly in the deposited film.

The process depicted in FIG. 1 can continue as long as necessary to build up a required thickness of the layer 16. Deposition from a constant vapor source is ensured by flowing the carrier gas and reactant gases continually across the surface 18.

Figure 2:
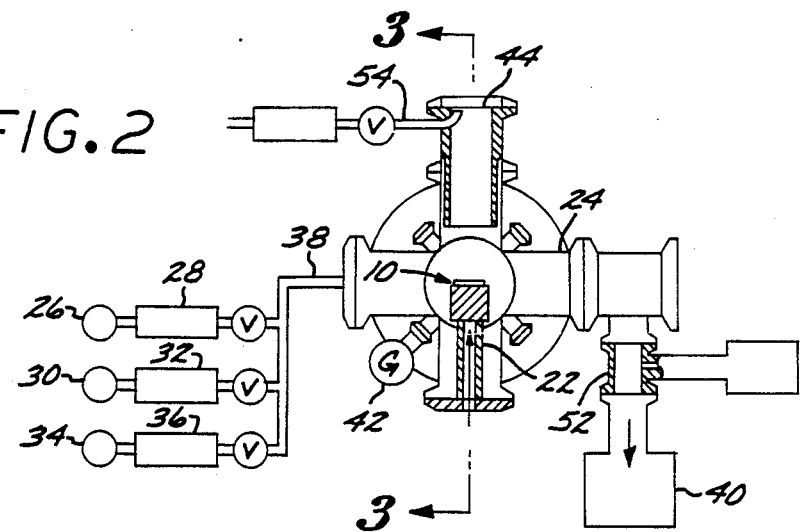
FIG. 2 is a side elevational view of an apparatus for laser-assisted chemical vapor deposition, with exterior components illustrated diagrammatically.
Figure 3:
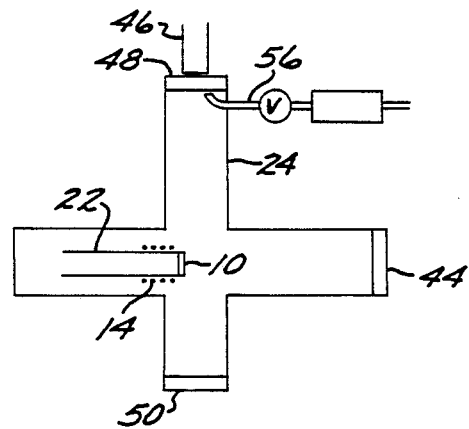
FIG. 3 is a side elevational view of the apparatus of FIG. 2, taken along line 3—3.

FIGS. 2 and 3 illustrate an apparatus for accomplishing the laser-assisted chemical vapor deposition of the invention. The substrate 10 is mounted on a stainless steel pedestal 22 in a stainless steel deposition chamber 24. The substrate heater, here illustrated as the coil 14, is wound onto the base and heated from an external power source (not shown). A first gas source 26 supplies the source of mercury, preferably divinylmercury, through a mass flow controller 28. A second gas source 30 supplies the source of tellurium, preferably diethyltellurium, through a mass flow controller 32. A third gas source 34 supplies the carrier gas, preferably helium, through a mass flow controller 36. The three gas flows are mixed together and introduced into the chamber 24 through a gas input port 38. The chamber 24 is continuously pumped by a vacuum pump 40, ensuring a continuous flow of the gas mixture through the chamber 24 and across the surface 18. Gas pressures are monitored by a capacitance manometer 42. The pressure and gas flow in the chamber 24 are controlled by a throttling valve 52 between the chamber 24 and the pump 40. The valve 52 is controlled by a microprocessor utilizing as its control signal the gas pressure measured by the capacitance manometer 42.

A window 44 is provided to view the deposition as it progresses. A flow of inert gas from a window purge system 54 purges the inside face of the window to prevent it from being fogged during deposition.

The grazing laser energy is provided by an excimer laser 46, aimed across the surface 18, from a side port 48 shown in FIG. 3. The laser is operated externally to the chamber 24, and its beam is introduced into the chamber through the optical port 48. A flow of inert gas from a port purge system 56 purges the inside face of the port 48, to prevent it from being fogged during deposition. After the beam passes through the region 20 and grazes the surface 18, thereby energizing the divinylmercury and diethyltellurium adjacent the surface 18 and aiding in their decomposition, the beam is extracted through an extraction port 50.

Figure 4:
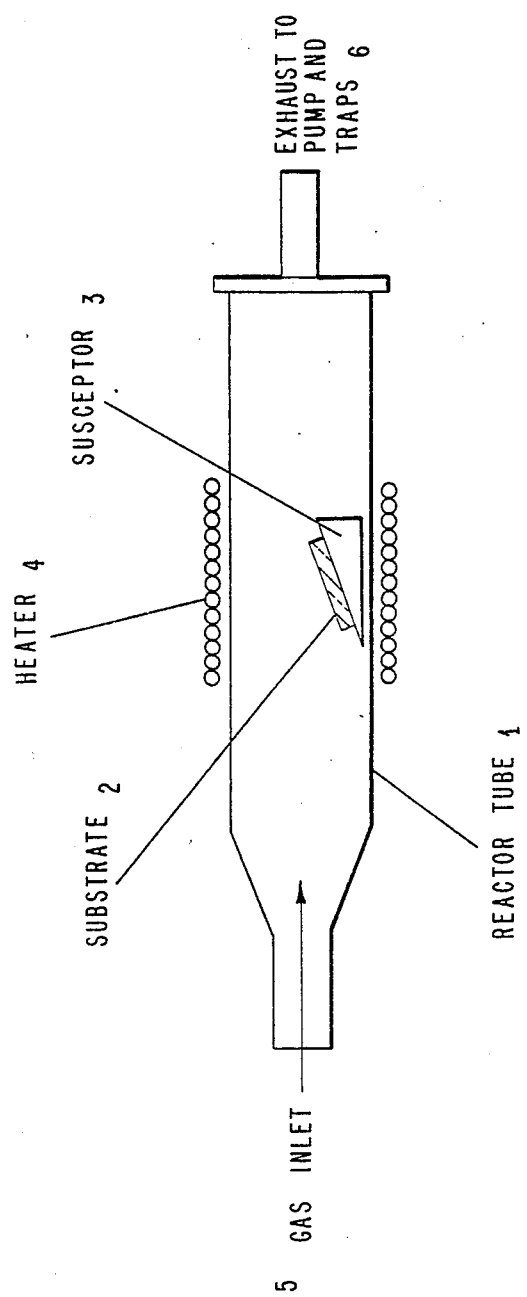
FIG. 4 is a side view of an apparatus for thermal assisted chemical vapor deposition.

In the case of thermal assisted chemical vapor deposition of mercury-containing compounds, in addition to the substrates previously mentioned, such as CdTe and CdZnTe, exemplary of other substrates which can be utilized are CdTeSe, $GaAs, Al_2O_3$ or Si and others. In thermal assisted chemical vapor deposition, exemplary apparatus such as that illustrated in FIG. 4 can be used. The substrate 2 is held on an inclined graphite susceptor 3 in a reactor tube 1. The substrate 2 is heated by heater 4, through the absorption of IR radiation (heat lamp), inductively with RF coils, or resistively (heater wires). The substrate should be heated to the lowest temperature which produces good quality film growth, but that temperature should also be high enough to dissociate the reactant source materials. Growth at low temperatures minimizes the formation of Hg vacancies in the layer. Hg vacancies are detrimental because they may adversely affect the electrical performance and reliability of devices fabricated in the deposited layer. The reactants, the vapor mixture of a mercury-containing organic compound having at least one vinyl group in a carrier gas and an organic compound containing an element to be codeposited with mercury, are transported into reactor tube 1 through the gas inlet 5. The reactants then contact the heated growth surface of the substrate 2 where they thermally decompose (dissociate) to produce the atoms for growth of the desired semiconductor layer. Illustrative of suitable carrier gasses are helium or hydrogen. After the reaction is complete, the remaining gasses are removed through exhaust outlet 6. The reactor may be operated at pressures of 706 to $10^{-4}$ Torr.

The following example is intended to illustrate aspects of the invention, and should not be taken as limiting of the invention in any respect.

EXAMPLE 1

The apparatus just described was operated in the following conditions, to deposit HgTe on a gallium arsenide substrate.

The gas flow was controlled so that the chamber 24 contained a mixture of 1-10 millitorr partial pressure of divinylmercury, 1-10 millitorr partial pressure of diethyltellurium, and the remainder helium, with a total system pressure of 10-80 Torr.

The substrate was a 1 centimeter square piece of galium arsenide, heated to 165° C. by the coil 14.

The laser was an krypton-fluorine excimer laser emitting energy at 248 nanometers. The laser pulsed for 30-60 nanoseconds, with a repetition rate of 5-80 Hertz. The energy in each pulse was 10-100 millijoules per square centimeter.

Samples were produced in this range, with the mercury telluride being deposited upon the substrate. The mercury telluride had a high quality surface morphology, and had a Hg:Te ratio of 1:1.

EXAMPLE 2

The apparatus described above was operated in the following conditions, to deposit a film of HgCdTe.

The gas flow was controlled so that the reactor contained 1-10 millitorr partial pressure of divinylmercury, 1-4 millitorr partial pressure of diethylcadmium, and 1-10 millitorr partial pressure of diethyltellurium. The gas flows were adjusted so that the Hg:Cd:Te ratio of the metals in the gas flow was 8:2:10.

The substrate was a layer of CdTe, which was about 0.5 micrometers thick, that had been previously deposited on a GaAs substrate 1 centimeter square in size. The temperature of the substrate was maintained at 165° C.

The laser excitation was as described above in Example 1. The total system pressure was 70-80 Torr.

Samples were produced, and the atomic ratio of Hg:Cd:Te in the deposited film was determined to be 4:6:10. This ratio is not the same as the ratio in the gas, but can be controlled by changing the gas phase composition ratios.

It will be appreciated that the present invention provides an improved process for laser-assisted chemical vapor deposition. The process is efficient, and results in a high-quality deposited layer.

Although a particular embodiment of the invention has been described in detail for purposes of illustration, various modifications may be made without departing from the spirit and scope of the invention. Accordingly, the invention is not to be limited except as by the appended claims.

What is claimed is:

1. A process for depositing a mercury-containing compound onto a substrate, comprising the steps of:
   providing a substrate;
   heating the substrate to a temperature of from about 100 C. to about 195 C.;
   contacting the substrate with a vapor mixture of a mercury-containing organic compound having at least one vinyl group, and at least one organic compound containing an element to be codeposited with mercury in a carrier gas; and
   exciting the vapor mixture with an activator selected from the group consisting of laser light and thermal heat and sufficient to deposit the mercury-containing compound in the region of contact between the vapor and the substrate.

2. The process of claim 1 wherein the activator is selected from the group consisting of laser light of a wavelength from about 180 to 300 nanometers and thermal heat.

3. The process of claim 1, wherein the temperature of the substrate is about 165° C.

4. The process of claim 1, wherein the mercury-containing compound is selected from the group consisting of divinylmercury and methylvinylmercury.

5. The process of claim 1, wherein the mercury is codeposited with a compound selected from the group consisting of tellurium and a mixture of tellurium and cadmium.

6. The process of claim 1, wherein the deposited mercury-containing film is doped with a dopant.

7. The process of claim 6, wherein the dopant is selected from the group consisting of arsenic and indium.

8. The process of claim 1, wherein the wavelength of the laser light is about 248 nanometers.

9. The process of claim 1, wherein the wavelength of the laser light is about 193 nanometers.

10. A process for depositing a compound containing mercury and tellurium onto a substrate, comprising the steps of:
    providing a substrate;
    heating the substrate to a temperature of about 165° C.;
    contacting the substrate with a vapor mixture of divinylmercury and diethyltellurium; and
    exciting the vapor mixture with laser light of a wavelength of about 248 nanometers, in the region of the contact between the vapor and the substrate.

11. The process of claim 10, wherein the vapor mixture contains dimethylcadmium, and the deposited compound contains mercury, cadmium, and tellurium.

12. A process for depositing a mercury-containing compound onto a substrate, comprising the steps of:
    providing a substrate;
    heating the substrate to a temperature of from about 100° C. to about 195° C.;
    contacting the substrate with a vapor mixture of a mercury-containing compound having a vapor pressure of at least 100 millitorr at ambient temperature, an absorption coefficient of at least 0.005 $Torr^{-1}centimeter^{-1}$ for light in the wavelength range of 180 to 300 nanometers, and a decomposition behavior of decomposing to mercury under sufficiently intense light in the wavelength range of 180 to 300 nanometers, and a vapor containing an element to be codeposited with mercury; and
    exciting the vapor mixture with laser light of a wavelength of from about 180 to about 300 nanometers, in the region of the contact between the vapor and the substrate.

13. The process of claim 12, wherein the mercury-containing compound is divinylmercury.

14. A process for depositing a mercury-containing compound onto a substrate comprising the steps of:
    (a) providing a substrate;
    (b) heating the substrate to a temperature from about 100 C. to about 195 C.;
    (c) contacting the substrate with a vapor mixture of a mercury-containing organic compound having at least one vinyl group and at least one organic compound containing an element to be codeposited with mercury in a carrier gas, and;
    (d) exciting the vapor mixture with thermal heat sufficient to deposit the compounds in the region of contact between the vapor and the substrate.

15. The process of claim 14 further comprising depositing the mercury-containing compounds at pressures of 760 to $10^{-4}$ Torr.

* * * * *